United States Patent [19]
Reinecke et al.

[11] Patent Number: 5,716,741
[45] Date of Patent: Feb. 10, 1998

[54] HIGH-PRECISION STEPPED MICROSTRUCTURE BODIES

[75] Inventors: Holger Reinecke, Dortmund; Arnd Rogner, Sprockhövel; Friedolin Franz Noeker; Ulrich Sieber, both of Karlsruhe; Gerd Pruefer, Asslar; Helge Pannhoff, Dortmund; Uwe Brenk, Kämpfelbach, all of Germany

[73] Assignee: MicroParts Gesellschaft für Mikrostrukturtechnik mbH, Dortmund, Germany

[21] Appl. No.: 626,793

[22] Filed: Apr. 2, 1996

Related U.S. Application Data

[60] Division of Ser. No. 467,927, Jun. 6, 1995, Pat. No. 5,529,681, which is a continuation-in-part of Ser. No. 216,290, Mar. 23, 1994, abandoned.

[30] Foreign Application Priority Data

Mar. 30, 1993 [DE] Germany .............. 43 10 296.4

[51] Int. Cl.⁶ .................................................. G03F 7/00
[52] U.S. Cl. .................................................. 430/8; 205/50
[58] Field of Search ................................ 430/8; 205/50

[56] References Cited

U.S. PATENT DOCUMENTS 5,234,571  8/1993  Noeker .
5,260,175  11/1993  Kowanz ........................ 430/326
5,311,604  5/1994  Rogner ........................... 385/14
5,529,681  6/1996  Reinecke et al. .

*Primary Examiner*—John Niebling
*Assistant Examiner*—Brendan Mee
*Attorney, Agent, or Firm*—Oblon, Spivak, McClelland, Maier & Neustadt, P.C.

[57] ABSTRACT

The present invention concerns stepped mould inserts, a method of producing the same and high-precision stepped microstructure bodies moulded therewith. The present stepped mould inserts and method of producing the same are more simple than previous methods. The lithographically produced regions of a patterned resist layer, which are exposed by development on a flat plate, are filled with metal. The layer may be mechanically removed, down to a predetermined thickness. After the residues of the resist have been dissolved out, if necessary or desired, this operation is repeated from one to several times. The regions removed from the resist layer are filled with metal, covered and separated from the resist layer, thus providing a multistep metallic mould insert. High-precision microstructure bodies having a multistep structure are produced with the present stepped mould insert.

7 Claims, 2 Drawing Sheets

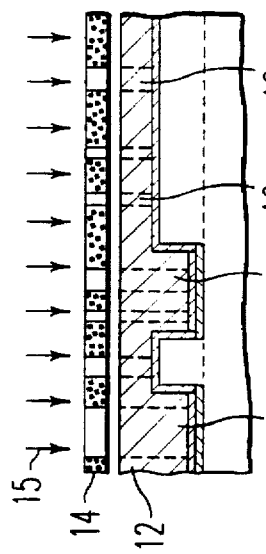
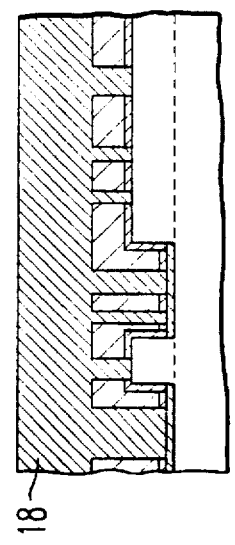
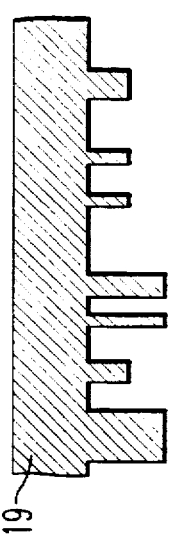
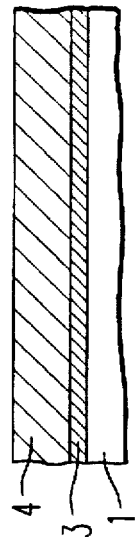
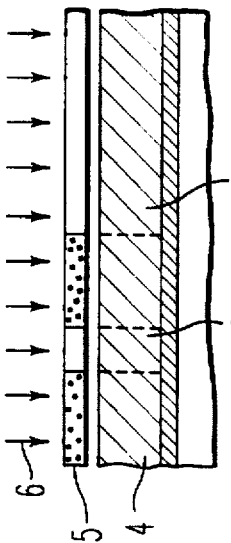
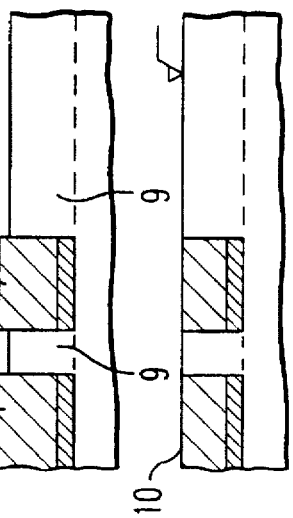
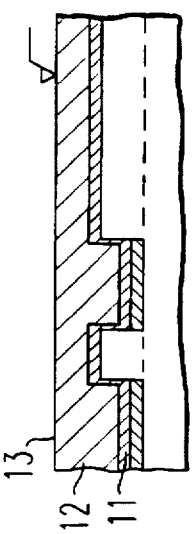
FIG. 1
FIG. 2
FIG. 3
FIG. 4
FIG. 5
FIG. 6
FIG. 7
FIG. 8
FIG. 9
FIG. 10

HIGH-PRECISION STEPPED MICROSTRUCTURE BODIES

This is a Division of application Ser. No. 08/467,927 now U.S. Pat. No. 5,529,681 filed on Jun. 6, 1995, which is a Continuation-in-Part of application Ser. No. 08/216,290 filed Mar. 23, 1994, abandoned.

This application claims priority under 35 U.S.C. 119 to German Patent Application No. 43 10 296.4, filed in Germany on Mar. 30, 1993, which is incorporated herein by reference.

BACKGROUND OF THE INVENTION

1. Field of the Invention

The present invention relates to stepped mould inserts with which stepped microstructure bodies are produced, and to methods of producing the stepped mould inserts and stepped microstructure bodies. One object of the present invention is to produce high-precision stepped microstructure bodies economically.

2. Discussion of the Background

Microstructure bodies produced by the LIGA method generally have microstructures having lateral dimensions in the micrometer range, accompanied by a height which may be several hundred micrometers. In general, the microstructure bodies are planar; i.e., the lateral dimensions of the microstructures are virtually constant over the entire height of the structure, and the side walls of the microstructures are parallel to one another.

For many applications, it is necessary to produce three-dimensional microstructures, but this is possible in this method using parallel irradiation only to a limited extent by inclining the specimen to the beam path.

Three-dimensional structures can in most cases be produced by a plurality of levels of planar structures having different structural height. This can be achieved by, for example, stepped construction on the baseplate.

According to EP 184 608, bodies having columnar microstructure can be produced, which have different heights in two regions. For this purpose, a layer of a plastic (resist material), the properties of which can be altered by X-ray radiation, is first partially irradiated with X-ray radiation through a patterned mask, in which process the entire thickness of the resist layer is penetrated by the X-ray radiation. The resist layer is then partially irradiated again with X-ray radiation through a second patterned mask, in which process the penetration depth of the radiation is less than the thickness of the resist layer and the irradiated regions are larger than in the case of the first irradiation. This process is in principle suitable for producing microstructure bodies having more than two different structural heights. A separate irradiation step is necessary for each structural height. For each irradiation step, use is made of a separate mask, which has to be positioned with high precision relative to the already irradiated regions of the resist layer. This appreciably increases the cost and noticeably decreases the yield. The precise step height, a smooth step level and a precise orthogonality with respect to the sides of the microstructure are difficult to establish.

EP 253 066 provides a method of producing microstructure bodies having regions with different structural heights. A resist layer is irradiated once through a single mask, the structure of which corresponds to the structure of the microstructure body (absorber structure) (X-ray depth lithography). The mask is composed of a patterned layer which absorbs the X-ray radiation almost completely (total absorber layer), and at least a further patterned layer which only partly absorbs the X-ray radiation (partial absorber layer). The resist material is a plastic having a sharp lower limit dose (for example, polymethyl methacrylate). For the partial absorber layers, substances are used which have different absorptive powers within the wavelength range of the X-ray radiation used. The nature of the partial absorber materials, their respective layer thickness, the spectrum of the X-ray radiation used and the radiation dose have to be matched to the desired different structural heights of the microstructure body. This method requires extensive calculations. In the case of this method, too, the precision of the microstructure is limited.

DE 41 42 001.2 describes the production of stepped mould inserts by combining mechanical precision machining and X-ray lithography. Owing to the machining methods, a finite precision of the step dimensions (limited to more than 10 micrometers) is achievable, particularly in relation to the stepslope area and the step height.

U.S. Pat. No. 5,190,637 teaches a method for the formation of microstructures by multiple level deep X-ray lithography with sacrificial metal layers. At first the voids in an exposed and developed photoresist layer are filled with a primary metal by electrodeposition. After removal of the remaining parts of the resist layer the thus created voids are filled with a secondary metal. This layer consisting of two different metals is machined down to a predetermined thickness. This series of method steps is—optionally multiply—repeated. The masks used for exposing the resist layers have patterns different from each other. Finally, the secondary (sacrificial) metal is removed by an etchant which does not etch the primary metal. The microstructure body formed is composed of several layers of the primary metal, said layers being formed during several steps. An adhesion promotor is optionally applied. It is well known that a microstructure body formed by such method is sensitive to high thermal and mechanical stress.

U.S. Pat. No. 4,351,653 teaches a method for producing separating nozzle elements by lithographically structuring a resist layer and electroplating a metal in the developed layer. These steps are multiply repeated to achieve a predetermined height of said structure. Each resist layer is exposed using the same mask. The metallic microstructure body is composed of several layers of said metal. The variation in thickness of said metal layers is not of any importance. The metallic microstructure body obtained after a final machining step has the same thickness at any point, consequently such body has no steps. It is well known that even said microstructure body is sensitive to high thermal and mechanical stress.

In summary, stepped mould inserts have been produced using patterned irradiation masks having locally varying absorption of X-ray radiation. For this purpose, extensive calculations are necessary. Furthermore, a plurality of masks may be used consecutively, and the penetration depth of the X-ray radiation may change for each irradiation step. These masks have to be positioned with high precision.

Consequently, a simple method of producing high-precision stepped mould inserts with which high-precision stepped microstructure bodies can then be moulded is still felt.

SUMMARY OF THE INVENTION

Accordingly, one object of the present invention is to provide a method of producing high-precision stepped mould inserts in a simple way, with which high-precision stepped microstructure bodies can then be moulded.

This object is achieved, according to the present invention, by a method of producing a stepped mould insert having lateral and vertical precision in the submicrometer region, and used for manufacturing of stepped microstructure bodies, consisting essentially of the steps:

(A) applying a first resist layer to a flat and plane-parallel baseplate, (B) irradiating the first resist layer through a first patterned mask to produce one or more readily soluble regions and one or more sparingly soluble regions in said first resist layer, (C) dissolving or removing the readily soluble regions of said first resist layer, (D) depositing a first metal in the regions of the first resist layer corresponding to the readily soluble regions to a height greater than a third thickness, followed by mechanically removing a first thickness of said first metal and a second thickness of said first resist layer until said first metal and said first resist layer have said third thickness which is less than said original height of said first resist layer and less than the original height of said first metal to produce one or more steps, (E) dissolving or removing the sparingly soluble regions of the first resist layer, (F) applying a final resist layer over all of said steps, (G) irradiating the final resist layer through an aligned final mask to produce one or more readily soluble regions and one or more sparingly soluble regions in said final resist layer, (H) dissolving the readily soluble regions of the final resist layer, (I) depositing a second metal in the regions of the final resist layer corresponding to the readily soluble regions and covering all of said regions with a layer of said second metal of up to several millimeters in thickness without interruption of this deposition step, (J) removing the baseplate and the remaining regions of the final resist layer, thus obtaining the stepped mould insert the structure of which being complementary to the structure of the stepped microstructure body manufactured by use of said stepped mould insert.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 1 to 10 show sequential steps in the production of a two-step mould insert (depicted in all cases in cross-section) using a positive resist.

DESCRIPTION OF THE PREFERRED EMBODIMENTS

Figure 11A:
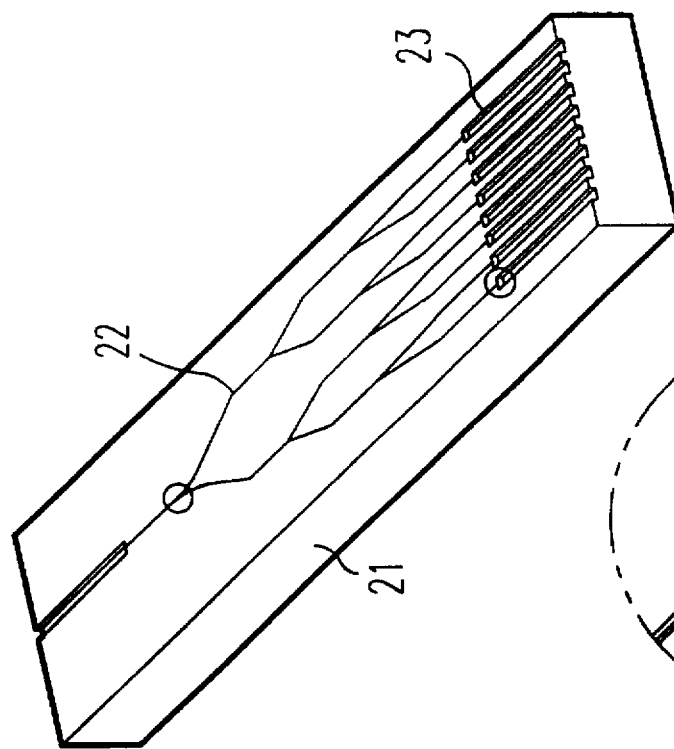
FIG. 11 shows an oblique view of a moulded plastic microstructure body having two steps, useful in the production of 1×8 couplers for optical waveguide networks.

The flat and plane-parallel baseplate is preferably composed of an electrically conductive material, more preferably of a metal such as copper, steel, aluminum, or titanium. If necessary, the conductive baseplate is provided with a resist adhesion layer. Alternatively, the baseplate may be made of an electrically nonconductive material. If necessary, the nonconductive baseplate is provided with an electroplating starter layer.

A first resist layer is applied to the baseplate to provide a step level in a manner conventional in lithography. The height of the first resist layer is higher than the step of the mould insert. The first resist layer is then irradiated through a mask, which is produced mechanically or lithographically. The structure of the mask is matched to the structure of the level.

The resist material used is either a positive resist (for example, poly(methyl methacrylate) (PMMA) (e.g., PLEXIT 60, manufactured by Röhm Chemische Fabrik) or a negative resist (for example, RAY-PN (AZ-PN), manufactured by Hoechst).

The irradiation step changes the solubility of the resist. In the case of a positive resist, the irradiated regions are more readily soluble than the unirradiated regions; in the case of a negative resist, the irradiated regions are less readily soluble than the unirradiated regions. In the present invention, the phrase "readily soluble region" refers to a region of a positive resist which has been irradiated and to a region of a negative resist which has not been irradiated. Similarly, the phrase "sparingly soluble region" refers to a region of a positive resist which has not been irradiated and to a region of a negative resist which has been irradiated.

Because of this solubility difference, the readily soluble regions of the resist can be dissolved with a solvent which selectively dissolves the readily soluble regions but does not appreciably dissolve the sparingly soluble regions. The sparingly soluble regions may be dissolved in a less selective, or stronger, solvent. The solubility of the resist relates to the action of a special solvent ("developer") under the chosen solution conditions.

After irradiating, the readily soluble regions of the resist layer are dissolved with a solvent ("developer"), and the solution is removed. For PMMA, for example, the GG developer disclosed in German patent application NO. 30 39 110 is preferable. This developer contains, for example, from 50 to 70 percent by volume (vol-%) of ethylene glycol monobutyl ether, from 1 to 20 vol-% of monoethanolamine and from 5 to 30 vol-% of tetrahydro-1,4-oxazine, and is preferably applied at a temperature of from 20° to 50° C., more preferably at a temperature of from 20° to 38° C. For the negative resist AZ-PN, aqueous ammonium hydroxide solution is preferable as a developer, more preferably aqueous ammonium hydroxide solution having a concentration in the range of from 1 to 3 mol per liter. Other alkaline solutions having a concentration in the range of from 1 to 3 mol per liter (M) are also suitable for dissolving the readily soluble regions of the negative resist.

The plane structure of the additional level for the first step is consequently laid bare in the resist layer down to the conductive baseplate or the conductive electroplating starter layer.

The regions our of which the more readily soluble material of the resist layer has been dissolved, corresponding to the readily soluble regions of the first resist layer, are filled with a first metal by electroplating or by electroless plating. Gold, nickel, copper and alloys thereof are suitable for this purpose. The thickness of the metal deposited is preferably less than the thickness of the resist layer. A predetermined thickness of the electrodeposited, patterned first metal layer is obtained either by controlling the electric current and the duration of the deposition of the metal, or by initially depositing the metal layer to a thickness greater than the thickness necessary for the first step level then mechanically removing the excess metal (just like the parts of the resist layer which have remained behind).

The spacing of this additional plane for the first step from the plane surface of the baseplate is achieved with a precision of ±0.5 micrometer. This spacing corresponds to the height of the first step. Due to the high smoothness of this additional plane and the smoothness of the surface of the baseplate, the height of the step is also achieved with a precision of ±0.5 micrometer. The sparingly soluble regions of the resist layer which have been left behind are dissolved out with a suitable solvent.

Further additional levels patterned in any desired way, and can be laid one on top of the other by repeating the method steps (A)–(E) described above with successive resist layers and if desired successive alternating metal layers. It is possible to achieve a precision in the lateral position of the individual layers with respect to one another in the micrometer range by lithography using aligned masks. In a preferred embodiment, the material of a successive resist layer is the same as the material of the preceding resist layer.

The entire thickness of each resist layer is preferably irradiated through a single patterned mask for each resist layer (for example, using X-ray radiation). The X-ray radiation is preferably the synchrotron radiation from an electron synchrotron having, for example, 2.3 GeV electron energy. The mask is aligned with respect to the structure already produced on the baseplate.

After the baseplate is provided with one or more additional patterned levels (or steps, respectively), the final resist layer is applied over all of the steps to a thickness which corresponds to the total height of the microstructure body to be moulded later. For this purpose, the surface of the final resist layer is, if necessary, removed by mechanical precision machining down to the desired height (also with a precision of ±0.5 μm).

The final resist layer is irradiated through a final mask, which is applied in an aligned manner, and the readily soluble regions of the final resist layer are subsequently dissolved and removed in accordance with the methods described above for the first resist layer. In a preferred embodiment, the final resist layer is the second resist layer, and the material of the second resist layer is the same as the material of the first resist layer.

Finally, a final metal is deposited (for example, by electrodepositing or electroless depositing) in the regions corresponding to the readily soluble regions removed from the resist layer. Gold, nickel, copper and alloys thereof are suitable for this purpose.

After the structure has been completely filled with the final metal, further metal is deposited (for example, by electrodepositing or electroless depositing) in a coherent layer up to several millimeters thick, in order to hold the mould insert together and make it sufficiently rugged for the subsequent moulding of microstructure bodies.

The metal deposited in the overgrowth (coherent) layer is essentially the same as the final metal used for filling the structure. The procedure in the present method of producing a stepped mould insert which results in filling in the spaces left by removing the readily soluble regions of the final resist layer and in forming the overgrowth layer is essentially a single depositing step without interruption.

When predetermining the thickness of the overgrowth layer, a compromise has to be made between mechanical ruggedness of the mould insert and the time required for the electrodeposition of metal. If necessary, the external contour of the electrodeposited, cohesive metal layer is mechanically machined.

The baseplate is removed (preferably mechanically) by a cutting machining process, such as milling or sawing. If necessary, the baseplate may also be pulled off. However, the most preferable removal method is one in which no machining forces occur, such as, for example, by spark erosion or etching. Combinations of different removal methods are also suitable.

If necessary, the exposed regions of the electrodeposited metal which are situated at the level of the baseplate surface after the removal of the baseplate are mechanically retouched.

The parts of the nonconductive and conductive interlayers which have been left behind in the electrodeposited metal body are then removed. For this purpose, after the removal of the baseplate, an adhesive may be poured over the exposed layer. The adhesive entrains the adhering parts of the layers to be removed from the metal structure. The adhesive is then peeled off after curing. On the other hand, those parts of the resist layer left behind can be dissolved out (if necessary, after flood irradiation), and adhesive is then poured over the plate to entrain the parts of the layers to be removed, cured, and subsequently peeled off.

Furthermore, the layers to be removed can be dissolved out selectively, for which purpose solvents are used which are especially adapted to dissolving the resist layer; e.g., potassium hydroxide solution (preferably having a concentration of from 1 to 3M) or acetone. Alternatively, the temperature of the developer can be increased to achieve the same result. For example, the GG developer removes PMMA completely at temperatures above 38° C.

After all of the substances to be removed have been removed from the electrodeposited metal structure, the finished metal mould insert is available. The range of thickness for each of the resist layers and for each of the metal layers may be from 10 to 1000 micrometers, preferably from 20 to 500 micrometers. A suitable range of thickness for each of the steps may be from 1 to 1000 micrometers, preferably from 2 to 500 micrometers.

With the aid of the stepped mould insert, stepped plastic microstructure bodies are moulded by known methods. Suitable plastics for moulding including poly (methylmethacrylate), polyoxymethylene, polycarbonate, polyamide, heat-resistant and/or chemical-resistant plastics such as, for example, polyvinylidene fluoride (PVDF) or polyetheretherketone (PEEK). Additional materials suitable for moulding with the present stepped mould insert include powdered sintered materials, such as known metal oxide and/or nitride ceramics. If necessary or desired, the powdered sintered materials may be rendered plastically deformable by adding a known binder thereto.

The plastic or sintered material microstructures which are thereby produced, and which are complementary to the microstructure of the stepped mould insert, can be removed in a known manner from the mould insert, thus providing the stepped microstructure body. The stepped mould insert can be used repeatedly for moulding such microstructure bodies.

The moulded, stepped microstructure body may have differently moulded microstructures in both lateral dimensions and may have different or equal heights perpendicular to the lateral extensions, also in the micrometer range. The present microstructure body has at least one step in a one-piece body, and has lateral dimensions which change virtually abruptly, relative to the overall height of the microstructure body.

Accordingly, the present invention also encompasses a stepped microstructure body having lateral and vertical precision in the submicrometer region, produced by moulding a material with the present stepped mould insert, wherein the stepped microstructure body:

(i) contains differently moulded microstructures having different or equal height, (ii) has at least one step in a one-piece body, and (iii) has lateral dimensions which change virtually abruptly, relative to the overall height of the microstructure body.

The moulded, stepped microstructure body may be composed of plastic, ceramic or sintered material, the stepped microstructure body being mechanically moulded and then removed from the mould insert. The present mould insert can be used repeatedly for moulding. Accordingly, the present invention also encompasses one or more stepped microstructure bodies made from a plastic, ceramic or sintered material, moulded with the present mould insert by a process comprising:

(A) mechanically moulding the stepped microstructure body, (B) removing the microstructure body from the mould insert, and (C) moulding a second stepped microstructure body with the mould insert.

The process may be repeated as often as desired, as long as a desired level of precision is retained in the product microstructure bodies.

The moulded, stepped microstructure body may also be composed of metal, in which case the stepped microstructure body is moulded by electroplating or electroless plating. The mould insert may then be de-moulded or dissolved after moulding (as a dead mould).

Metallic mould inserts having suitable microstructure (for example, having conically extending walls or having a small aspect ratio) can be transformed into a complementary structure. The complementary structure may be composed, for example, of plastic or metal. To prepare a metal complementary structure, a relatively noble metal (such as gold or platinum) is electrodeposited or electrolessly deposited in a mould insert made of a relatively base metal (for example, copper or nickel). The relatively noble metal may be deposited up to the height of the surface of the baseplate originally present. Alternatively, further metal may be deposited to a thickness greater than the height of the surface of the base plate, and thus, be allowed to overgrow the microstructure. The mould insert can then be de-moulded from the complementary structure. In this case, the mould insert can be used repeatedly. If de-moulding is not possible, the mould insert may be dissolved after moulding (as a dead mould).

In the moulding of a microstructure body by means of the mould insert, the structure of the microstructure body is complementary to the structure of the mould insert. In the moulding of a microstructure body by means of a complementary structure, the structure of the microstructure body corresponds to the structure of the mould insert.

The present method may comprise, inter alia, all the steps of the LIGA method. The LIGA method comprises the fundamental steps of lithographing and galvanically depositing metal and moulding. Lithography and galvanic deposition of metal are primarily directed toward fabrication of a mould insert. The microstructure bodies are preferably obtained by moulding, using a microstructured metal mould insert.

The present method, the stepped mould inserts produced therewith and the present moulded, stepped microstructure bodies have the following advantages:

(1) The lateral precision of the steps patterned by X-ray lithography and the vertical precision of the step height are in the submicrometer range.

(2) The positional precision of the individual levels with respect to one another is in the submicrometer to micrometer range, depending on alignment expenditure.

(3) The stepped mould insert is extremely true to size because it is built up on a solid baseplate during each of the method steps.

(4) The method of producing the stepped mould insert has little susceptibility to errors, and the proportion of rejects during manufacture is low.

(5) The surfaces present in the subsequent moulding are produced lithographically in the resist layer. As is known, such surfaces have a very low peak-to-valley height. The base and additional levels produced by mechanical precision machining also have a low peak-to-valley height, when the machining comprises polish milling.

(6) The additional levels are produced in advance, and their height position is controllable and reworkable in all cases, both additively (by further metal deposition) and subtractively (by removal).

(7) Machines having high reproducibility and high dimensional accuracy are used for the surface machining of the additional levels on the baseplate.

(8) The stepped mould insert is produced by electrodeposition of metal without interruption.

(9) The microstructure body obtained by the method according to the invention is very stable against high thermal and mechanical stress owing to the fact that the metal is deposited in and overgrown on a stepped resist structure in essentially a single depositing step without interruption. Said microstructure body is suitable as stepped mould insert for moulding a large number of stepped complementary structured microstructure bodies of high precision.

Other features of the present invention will become apparent in the course of the following descriptions of exemplary embodiments which are given for illustration of the invention, and are not intended to be limiting thereof.

EXAMPLE

The present invention is explained in greater detail with reference to FIGS. 1 to 11. FIGS. 1 to 10 show the production of a two-step mould insert (depicted in all cases in cross-section) using a positive resist.

The baseplate (1) is composed of copper and has a flat surface (2). The copper plate may also have a surface plane-parallel with respect to its lower side. An adhesion layer (3) is first applied to the surface (2), and a layer (4) of a first X-ray resist (for example, of poly(methyl methacrylate)) is applied to the top of the adhesion layer. The first resist layer (4) is thicker than the height of the step envisaged. The first X-ray mask (5) (for example, produced by lithography and mechanical electroforming) has regions which (a) are transparent to X-ray radiation and (b) have a structure corresponding to the desired structure of the more highly situated additional level.

The resist layer (4) is irradiated with synchrotron radiation (6) through the X-ray mask. In this process, the irradiated regions (7) of the first resist layer become soluble. These regions are dissolved out using the GG developer at a temperature of 25° C. The developer was removed by rinsing with deionized water. The baseplate and remaining first layer were dried under reduced pressure (for 100–300 mbar).

Copper is electrodeposited in the regions dissolved out of the first resist layer. As shown in FIG. 4, the copper layer (9) is preferably somewhat thinner than the thickness of the first resist layer (8) left behind, but somewhat thicker than the desired final thickness of the metal layer, the first resist layer. The layer of resist and copper is removed by a polish milling machine to the desired step height (10) with the specified accuracy (for example, ±0.5 μm; see FIG. 5).

Those parts (8) of the first resist layer left behind are dissolved out. A further adhesion layer (11) and a second (and in this case, final) resist layer (12) are applied to the patterned copper layer, over the adhesion layer (3). The material of the second resist layer is the same as the material of the first resist layer. The second resist layer (12) is removed mechanically to the desired height (13) with the specified precision (for example, 1 μm).

A second (and in this case, final) X-ray mask (14), which is patterned differently from the pattern of the first mask (5) in accordance with the structure to be produced on the first and second levels, is arranged in an aligned manner over the free side of the second resist layer (12). The second resist layer (12) is irradiated through the second mask (14) with synchrotron radiation (15). The regions (16a) which have become readily soluble above the second level and those (17a) above the first level are dissolved out. The readily soluble regions of the second resist layer as well as of the first resist layer are removed by the same process using the same solvent as was used for the readily soluble regions of the first resist layer. As a result of this dissolution process, trenches (16b) and (17b) of suitable shape and size are produced.

The height of the trenches is established by introducing metallic interlayers. The trenches are filled with a metal (18) (for example, nickel), then covered with a metal layer. The baseplate, including the steps, is then removed (mechanically and/or chemically), and the residues of the adhesion layers and of the second resist layer (12) are dissolved out by the same process as for the first and second resist layers.

Plastic microstructure bodies are moulded with the microstructured metal body (19) (for example, of nickel) as the mould insert. The precision of said microstructure bodies is in the micrometer to submicrometer range for (A) the arrangement of the structures in the two levels and (B) in the spacing of the levels. The shrinkage occurring during moulding with plastics is accounted for in producing the mould insert.

Figure 11C:
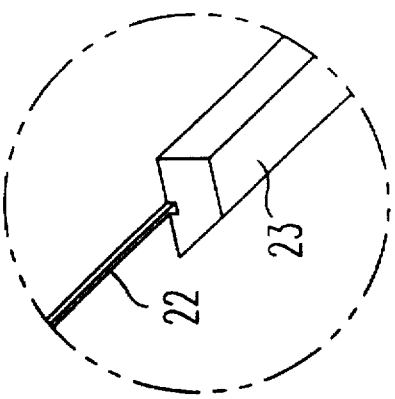
Figure 11B:
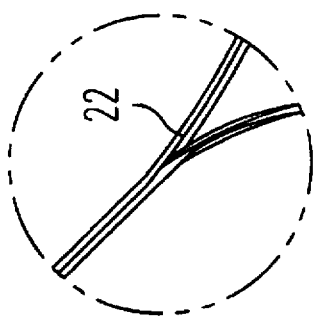

FIG. 11 shows an oblique view, as an example, of a moulded plastic microstructure body (21) having two steps for producing 1×8 couplers for optical waveguide networks. In the upper level, the trenches (26) are preforms for integrated optical waveguides. The trenches (22) are, for example, 9 μm wide and 7 μm deep. In the lower level, ends of the waveguide fibers to be coupled are precisely introduced into the guide trenches (23), in which these fiber ends are permanently fixed. The guide trenched (23) are, for example, 66 μm deep, 125 μm wide and about 5 mm long.

The spacing between the two levels (from the floor of the guide trench to the floor of the waveguide preform trench) is, for example, (59.0±0.2) μm, and can be produced and reproduced precisely by the present method.

The perpendicular plane in the center of the guide trench is displaced by less than 0.5 μm with respect to the perpendicular plane in the center of the associated waveguide preform trench.

Details relating to the manufacture of such integrated optical components are provided, for example, in DE 42 17 526.7.

Obviously, numerous modifications and variations of the present invention are possible in light of the above teachings. It is therefore to be understood that within the scope of the appended claims, the invention may be practiced otherwise than as specifically described herein.

What is claimed as new and is desired to be secured by Letters Patent of the United States is:

1. A stepped microstructure body having lateral and vertical precision in the submicrometer region, produced by moulding a material with the stepped mould prepared by the method consisting essentially of the steps:

(A) applying a first resist layer to a flat and plane-parallel baseplate, (B) irradiating the first resist layer through a first patterned mask to produce one or more readily soluble regions and one or more sparingly soluble regions in said first resist layer, (C) dissolving or removing the readily soluble regions of said first resist layer, (D) depositing a first metal in the regions of the first resist layer corresponding to the readily soluble regions to a height greater than a third thickness, followed by mechanically removing a first thickness of said first metal and a second thickness of said first resist layer until said first metal and said first resist layer have said third thickness which is less than said original height of said first resist layer and less than the original height of said first metal to produce one or more steps, (E) dissolving or removing the sparingly soluble regions of the first resist layer, (F) applying a final resist layer over all of said steps, (G) irradiating the final resist layer through an aligned final mask to produce one or more readily soluble regions and one or more sparingly soluble regions in said final resist layer, (H) dissolving the readily soluble regions of the final resist layer, (I) depositing a second metal in the regions of the final resist layer corresponding to the readily soluble regions and covering all of said regions with a layer of said second metal of up to several millimeters in thickness without interruption of the deposition step, and (J) removing the baseplate and the remaining regions of the final resist layer, thus obtaining the stepped mould insert the structure of which being complementary to the structure of the stepped microstructure body manufactured by use of said stepped mould insert, wherein said stepped microstructure body:

(i) contains differently moulded microstructures having different or equal height, (ii) has at least one step in a one-piece body, and (iii) has lateral dimensions which change virtually abruptly, relative to the overall height of the microstructure body.

2. The stepped microstructure body of claim 1, wherein said material is plastic, ceramic or sintered, and said moulding comprises:

(A) mechanically moulding said stepped microstructure body, (B) removing said microstructure body from said mould insert, and (C) moulding a second stepped microstructure body with said mould insert.

3. The stepped microstructure body of claim 1, wherein said material is metal, and said moulding comprises:

(A) electrodepositing or electrolessly depositing a metal to form said stepped microstructure body, and (B) de-moulding said mould insert to produce a metallic microstructure body.

4. The stepped microstructure body of claim 1, wherein said material is plastic, ceramic, sintered or metal, and said moulding comprises:

(A) moulding a complementary structure to said stepped mould insert, (B) forming a stepped microstructure body in said complementary structure, and (C) de-moulding or dissolving said complementary structure to produce said microstructure body.

5. The stepped microstructure body of claim 4, wherein said forming step (B) comprises electrodepositing, electroless depositing, or a technique known in powder technology.

6. The stepped microstructure of claim 1, wherein said material is ceramic or sintered, and said moulding comprises:

(A) mechanically moulding said stepped microstructure body, (B) removing said microstructure body from said mould insert, and (C) moulding a second stepped microstructure body with said mould insert.

7. The stepped microstructure body of claim 1, wherein said material is ceramic, sintered or metal, and said moulding comprises:

(A) moulding a complementary structure to said stepped mould insert, (B) forming a stepped microstructure body in said complementary structure, and (C) do-moulding or dissolving said complementary structure to produce said microstructure body.

* * * * *

UNITED STATES PATENT AND TRADEMARK OFFICE
CERTIFICATE OF CORRECTION

PATENT NO. : 5,716,741
DATED: : FEBRUARY 10, 1998
INVENTOR(S) : HOLGER REINECKE ET AL

It is certified that error appears in the above-identified patent and that said Letters patent is hereby corrected as shown below:

Column 4, line 57, "our" should read --out--.

Column 9, line 31, "far" should read --for--.
line 55, "(26)" should read --(22)--.
line 60, "trenched" should read --trenches--.
line 64, "(59.0±0.2)" should read --(59.0±0.5)--.

Signed and Sealed this

Twenty-first Day of July, 1998

Attest:

BRUCE LEHMAN

*Attesting Officer*      *Commissioner of Patents and Trademarks*